US006566854B1

(12) United States Patent
Hagmann et al.

(10) Patent No.: US 6,566,854 B1
(45) Date of Patent: May 20, 2003

(54) APPARATUS FOR MEASURING HIGH FREQUENCY CURRENTS

(75) Inventors: Mark J. Hagmann, North Salt Lake, UT (US); John F. Sutton, Dayton, MD (US)

(73) Assignees: Florida International University, Miami, FL (US); The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 09/646,161

(22) PCT Filed: Feb. 22, 1999

(86) PCT No.: PCT/US99/03878

§ 371 (c)(1),
(2), (4) Date: Nov. 2, 2000

(87) PCT Pub. No.: WO99/46607

PCT Pub. Date: Sep. 16, 1999

Related U.S. Application Data (60) Provisional application No. 60/077,954, filed on Mar. 13, 1998.

(51) Int. Cl.[7] ............................................. G01R 33/00
(52) U.S. Cl. .................................. 324/117 R; 324/127
(58) Field of Search ............................ 324/117 R, 127, 324/318, 130, 129, 961, 117 H, 106, 442; 323/357

(56) References Cited

U.S. PATENT DOCUMENTS

| | | | |
|---|---|---|---|
| 3,434,052 A | 3/1969 | Féchant | 324/127 |
| 3,716,867 A | 2/1973 | Mayes et al. | 343/701 |
| 3,721,900 A | 3/1973 | Andrews | 324/95 |
| 3,794,914 A | 2/1974 | Aslan | 324/95 |
| 3,885,213 A | 5/1975 | Rioux et al. | 324/127 |
| 3,931,573 A | 1/1976 | Hopfer | 324/106 |
| 3,953,799 A | 4/1976 | Albee | 325/376 |
| 4,207,518 A | 6/1980 | Hopfer | 324/95 |
| 4,220,920 A * | 9/1980 | Gross | 324/442 |
| 4,266,190 A * | 5/1981 | Lipman | 324/117 R |
| 4,383,260 A | 5/1983 | Ryan | 343/701 |
| 4,442,434 A | 4/1984 | Baekgaard | 343/701 |
| 4,887,029 A * | 12/1989 | Hemminger | 324/142 |
| 4,897,600 A | 1/1990 | Hagmann et al. | 324/127 |
| 5,138,254 A | 8/1992 | Wright | 324/119 |
| 5,296,866 A | 3/1994 | Sutton | 343/701 |
| 5,311,198 A | 5/1994 | Sutton | 343/701 |
| 5,451,865 A * | 9/1995 | Coburn | 324/127 |
| 5,508,606 A * | 4/1996 | Ryczek | 324/117 R |
| 6,018,238 A * | 1/2000 | Shafie | 324/117 R |
| 6,323,636 B1 * | 11/2001 | Cattaneo et al. | 324/127 |

FOREIGN PATENT DOCUMENTS

| | | |
|---|---|---|
| FR | 2 538 908 | 7/1984 |
| GB | 954559 | 4/1964 |

OTHER PUBLICATIONS

Anderson, "Wide Frequency Range Current Transformers," *The Review of Scientific Instruments*, vol. 42, no. 7, pp. 915–926, Jul. 1971.

(List continued on next page.)

*Primary Examiner*—Kamand Cuneo
*Assistant Examiner*—Russell M. Kobert
(74) *Attorney, Agent, or Firm*—Marshall, Gerstein & Borun (57) ABSTRACT

An apparatus for measuring high frequency currents includes a non-ferrous core current probe that is coupled to a wide-band transimpedance amplifier. The current probe has a secondary winding with a winding resistance that is substantially smaller than the reactance of the winding. The sensitivity of the current probe is substantially flat over a wide band of frequencies. The apparatus is particularly useful for measuring exposure of humans to radio frequency currents.

25 Claims, 8 Drawing Sheets

OTHER PUBLICATIONS

Blackwell, "The Personal Current Meter —A Novel Ankle–Worn Device for the Measurment of RF Body Current in a Mobile Subject," *J. Radiol. Prot.*, vol. 10, No. 2, pp. 109–114, Dec. 7, 1989.

Hagmann et al., "Noninvasive Measurement of Current in the Human Body for Electromagnetic Dosimetry," *IEEE Transactions on Biomedical Engineering*, vol. 40, No. 5, May 1993.

Pellinen et al., "Rogowski Coil for Measuring Fast, High–Level Pulsed Currents," *Rev. Sci. Instrum.*, vol. 51, No. 11, Nov. 1980.

Model 8870 Contact Current Meter, Loral Product Brochure, undated.

Model 8850B Induced Current Meter, Loral Product Brochure, undated.

Model 8854B Induced Current Monitor/Workmat, Loral Product Brochure, undated.

* cited by examiner

APPARATUS FOR MEASURING HIGH FREQUENCY CURRENTS

RELATED APPLICATION

This application claims the benefit of the filing date of a provisional patent application entitled "Instruments for Wide-Band RF Current Measurements," bearing serial No. 60/077,954, and filed on Mar. 13, 1998.

BACKGROUND OF THE INVENTION (a) Field of the Invention

The present invention relates generally to an apparatus for the non-invasive wide-band measurement of high frequency currents. More particularly, it relates to an apparatus which surrounds a conductor and measures the high frequency currents in the conductor by transducing the magnetic field produced by the currents.

(b) Description of Related Art

Non-invasive current measurements are commonly made using a split-core transformer assembly that can be opened and then clamped around a current carrying power line. These clamp-on ammeters typically consist of a ferrous core wrapped with a secondary winding. When clamped around a power line, changing currents in the power line or primary circuit produce a changing magnetic flux that is coupled through the core to the secondary winding. The coupled flux produces a voltage across the secondary winding that is proportional to the rate of change in primary current. Thus, clamp-on ammeters provide a simple, non-invasive apparatus for measuring current in a conductor by deriving the primary current from the secondary voltage. Clamp-on ammeters are frequently used to measure the power consumption of large electric motors in commercial and industrial applications. Their applications are limited, however, because they are optimized to operate at power line frequencies of 50 Hz or 60 Hz, and their accuracy decreases significantly for small variations in the power line frequency.

The measurement of high frequency currents has become an increasing concern because humans are being subjected to an increasing number of electromagnetic radiators. Of particular concern are industrial workers who may be exposed to large doses of electromagnetic radiation from radio frequency heat sealers, inductive heaters, and high voltage power transmission lines. Another area of special concern includes cancer patients undergoing therapeutic treatments, such as diathermy and hyperthermia, that apply localized high frequency electromagnetic energy directly to the patient's body. These treatments, although promising, are difficult to apply with precision because present application methods provide poor feedback to the physician regarding the dose and aberrant heating within the patient's body. Aberrant heating can, and often does, cause significant damage to the patient's body.

Thus, there is a strong commercial need for a non-invasive device that can accurately measure a broad range of high frequency currents. More specifically, there is a considerable need for such a device that is readily adaptable for use in measuring these high frequency currents within the human body.

Traditionally, the non-invasive measurement of high frequency currents is accomplished using the same principle employed by clamp-on ammeters. To operate effectively, high frequency ammeters or current probes use special transformer geometries, materials, and construction. Typically, high frequency current probes use ferrous cores wrapped with a low resistance secondary winding. These types of high frequency current probes offer excellent sensitivity to the magnetic fields generated by high frequency currents, but they suffer from several serious drawbacks. The ferrous core increases the inductance of the primary circuit (i.e., the conductor being monitored), and the magnitude of the this inductance increases as the conductor (e.g., a human limb) occupies a larger fraction of the probe aperture. Additionally, the ferrous core has a high permeability coefficient that efficiently couples impedances in the secondary circuit, such as the winding resistance and the input impedance of the meter connected to the secondary winding (e.g., a 50Ω input), into the primary circuit. These changes in the primary circuit impedance due to the presence of the current probe are commonly referred to as insertion impedances. Insertion impedances are highly undesirable because they change the primary current that would normally be flowing in the absence of the current probe. As a result, measurement errors can be significant, particularly in applications requiring the measurement of low-level magnetic fields. Additionally, ferrous cores have a permeability coefficient that varies with frequency, they are heavy and inflexible, they must have a small aperture size to be practicable, they are subject to magnetic saturation, and they are expensive. Thus, ferrous core current probes are not readily adaptable for use in measuring high frequency currents in the limbs and other portions of a human body.

Many drawbacks inherent in current probes with ferrous cores can be overcome by using a construction based on a non-ferrous core. Non-ferrous cores may be made from a variety of plastics, or may be a hollow form that supports the secondary winding over a core consisting primarily of air. Such non-ferrous cores do not substantially disturb the primary currents they are measuring because their insertion impedance is much smaller than that of ferrous core types. Furthermore, non-ferrous cores have a permeability coefficient ($\mu_o$) that does not vary with frequency, they are not subject to magnetic saturation, they can be constructed to form lightweight, flexible loops with a large aperture size, and they are inexpensive. Thus, non-ferrous core current probes are readily adaptable for accurately measuring high frequency currents in a human body.

Although non-ferrous core current probes show great promise in the measurement of high frequency currents within the human body, they continue to suffer from several practical problems. First, the secondary winding of such non-ferrous core probes must incorporate series or shunt resistance to prevent resonances that would otherwise cause extreme variations in sensitivity as a function of frequency. This resistive loading of the secondary reduces the sensitivity and signal-to-noise ratio of the current probe. The sensitivity is also reduced because of the lower permeability of the core. Furthermore, because the voltage output is proportional to the rate of change of the magnetic flux through the secondary winding, the ratio of the output voltage to the primary current is proportional to the frequency. The combined effects of resistive loading, low permeability, and the fundamental frequency dependance of sensitivity significantly limit the useful frequency bandwidth of these probes. In addition, the lower sensitivity and poor signal-to-noise ratio of non-ferrous current probes present difficulties in accurately measuring the low-level magnetic fields produced by the high frequency currents passing through a human body. These limitations both impair and limit the number of viable commercial applications. In practice, existing non-ferrous current probes are limited to applications having fundamental frequencies above 100 MHz. This limited bandwidth prevents their application in several commercial applications such as RF heat sealers that expose factory operators to 27.12 MHz radiation.

SUMMARY OF THE INVENTION

In accordance with one aspect of the present invention, an apparatus for measuring high frequency currents includes a non-ferrous core current probe that is coupled to a wideband transimpedance amplifier. The current probe has a secondary winding with a winding resistance that is substantially smaller than the reactance of the winding so that the sensitivity of the current probe is substantially flat over a wide band of frequencies.

DESCRIPTION OF THE PREFERRED EMBODIMENTS

It is desirable to increase the sensitivity, and greatly extend the useful bandwidth of non-ferrous current probes so that greater flexibility in their commercial application can be achieved. Present non-ferrous current probes suffer from a low sensitivity and limited bandwidth because they use a high resistance secondary winding or resistive shunting to prevent resonance conditions, and because traditional signal conditioning techniques result in an inherent reduction in sensitivity as frequency decreases. The present invention overcomes these difficulties by using a non-ferrous current probe having a low resistance secondary winding in combination with a wide-band transimpedance amplifier circuit.

The basic principles for the design and fabrication of non-ferrous core current probes are well known in the art, and are described, for example, in a U.S. Pat. No. 4,897,600 to Hagmann et al., which is incorporated herein by reference in its entirety. As described in more detail below, many known materials and techniques may be used in making a non-ferrous current probe in accordance with the present invention. In contrast to known non-ferrous current probes, however, the present invention uses a current probe winding that is specifically adapted to provide a winding resistance that is substantially smaller than the inductive reactance of the winding over a wide-band of frequencies.

Figure 1:
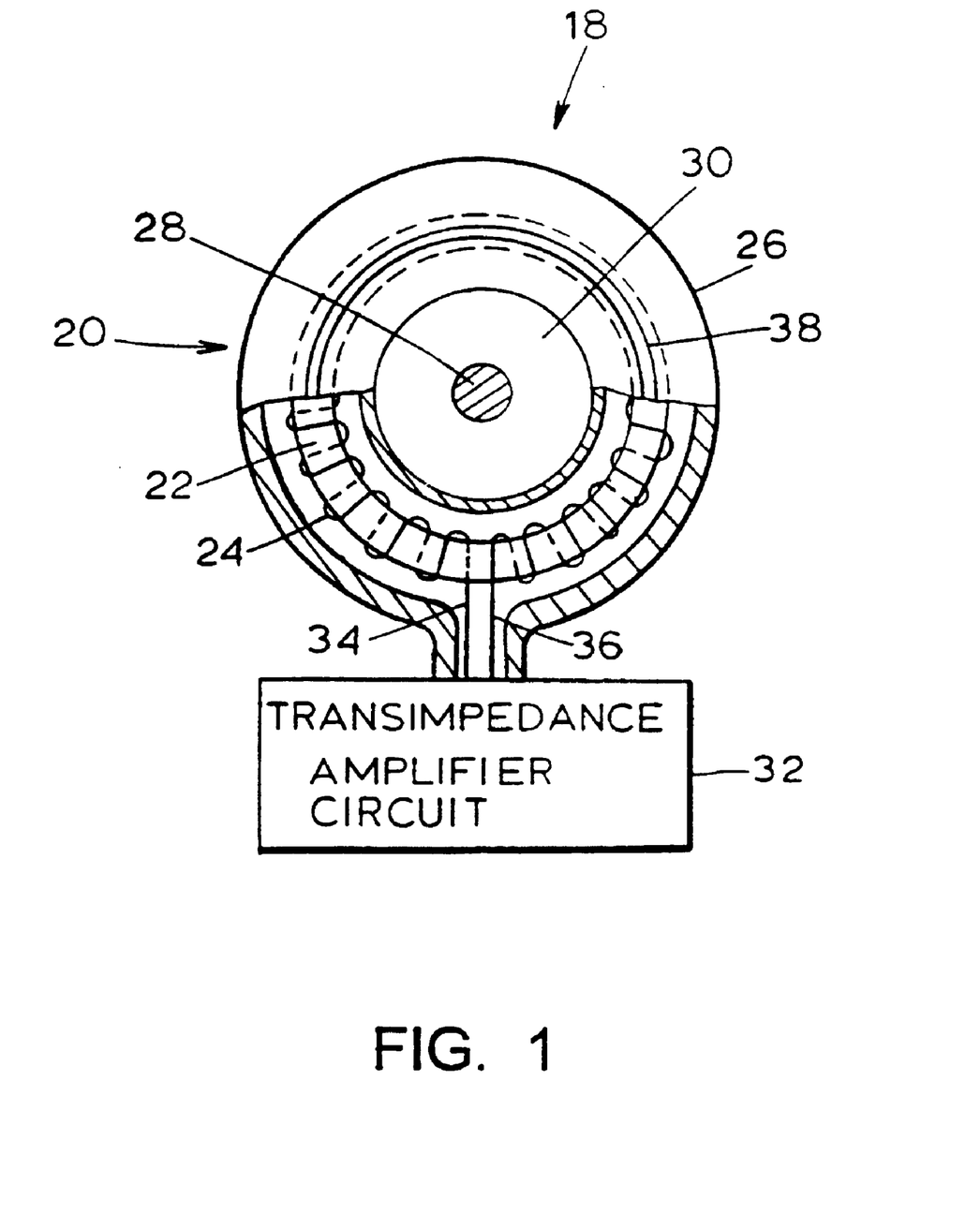
FIG. 1 illustrates a high frequency current meter that embodies aspects of the present invention.

FIG. 1 illustrates a high frequency current meter 18 that embodies aspects of the present invention. The current meter 18 includes a current probe 20 that is coupled to a transimpedance amplifier circuit 32. The current probe 20 has a toroidal geometry and includes a non-ferrous core 22 wrapped with a low resistance secondary winding 24, and a shield 26 that encases the secondary winding 24. In operation, a current carrying conductor 28, which may be a portion of a human body, passes through an aperture 30 of the probe 20. As is well-known in the art, changing currents in the conductor 28 generate a changing magnetic field that surrounds the conductor 28. In accordance with Faraday's law of induction, this changing magnetic field induces currents in the secondary winding 24. The secondary currents are conducted from the current probe 20 to a transimpedance amplifier circuit 32 via wires 34, 36. Thus, the high frequency current meter 18 may be used to non-invasively measure currents passing through the conductor 28.

The non-ferrous core current probe 20 is preferably constructed to facilitate its use in measuring high frequency currents in a human body. For example, the non-ferrous core 22 may be made of a flexible, lightweight plastic material. This allows the probe 20 to more easily adapt to the irregular contours of a human body and provides a higher degree of comfort for the person being monitored. Also, preferably, the core 22 is made of a material having a low permeability so that the insertion impedance it produces is negligible and does not substantially change the high frequency currents passing through the body.

The non-ferrous core 22 may be a solid or hollow form that supports the winding 24. The cross-sectional profile of the core 22 (i.e., a cross section taken in a plane parallel to its axis) may be circular or elliptical, but could alternatively be rectangular or any other shape. Although the cross-sectional profile of the non-ferrous core 22 is not critical to the operation of the invention, the length of the core 22 preferably defines a substantially closed loop around the conductor 28.

In accordance with the present invention, the winding 24 of the probe 20 is made from a low resistivity material such as copper wire or a thin conductive film. The winding 24 is preferably wrapped around the core 22 in multiple turns so that the ratio of the turns spacing to the cross sectional area of the core 22 remains constant. As is known in the art, this provides an uniform sensitivity along the length of the probe 20 so that the exact position of the conductor 28 within the aperture 30 of the probe 20 does not effect the output of the probe 20.

In contrast to known approaches, the material and the number of turns used for the winding 24 are specifically selected so that the resistance of the winding 24 is substantially smaller than the reactance of the winding 24 and so that the frequency response of the current meter 18 is optimized over a wide-band of frequencies.

Additionally, the material for the winding 24 is selected so that the resistance of the winding 24 remains substantially constant over frequency and temperature. For example, the use of thin conducting films such as a metallized Mylar may be preferred for some embodiments because the resistance of a conventional wire tends to increase with frequency due to the well-known skin effect. This skin effect can be minimized or eliminated by using a thin film conductor having a film thickness that is smaller than its skin depth at the highest operative frequency.

The shield 26 of the probe 20 may be fabricated using known materials and techniques so that the effects of stray fields on the output of the probe 20 are minimized. For example, as shown in FIG. 1, the shield 26 preferably includes a gap 38, oriented in the plane perpendicular to the axis of the current probe 20, that circumvents the length of the probe 20. The gap 38 prevents the flow of transverse currents in the shield 26 that could induce an incorrect reading in the meter 18. The shield 26 may be made from a low resistivity material such as aluminum, or may alternatively be made from a high resistivity material such as carbon-loaded Teflon. Also, preferably, the shield 26 is spaced from the winding 24 to minimize capacitive coupling between the shield 26 and the winding 24.

Figure 2:
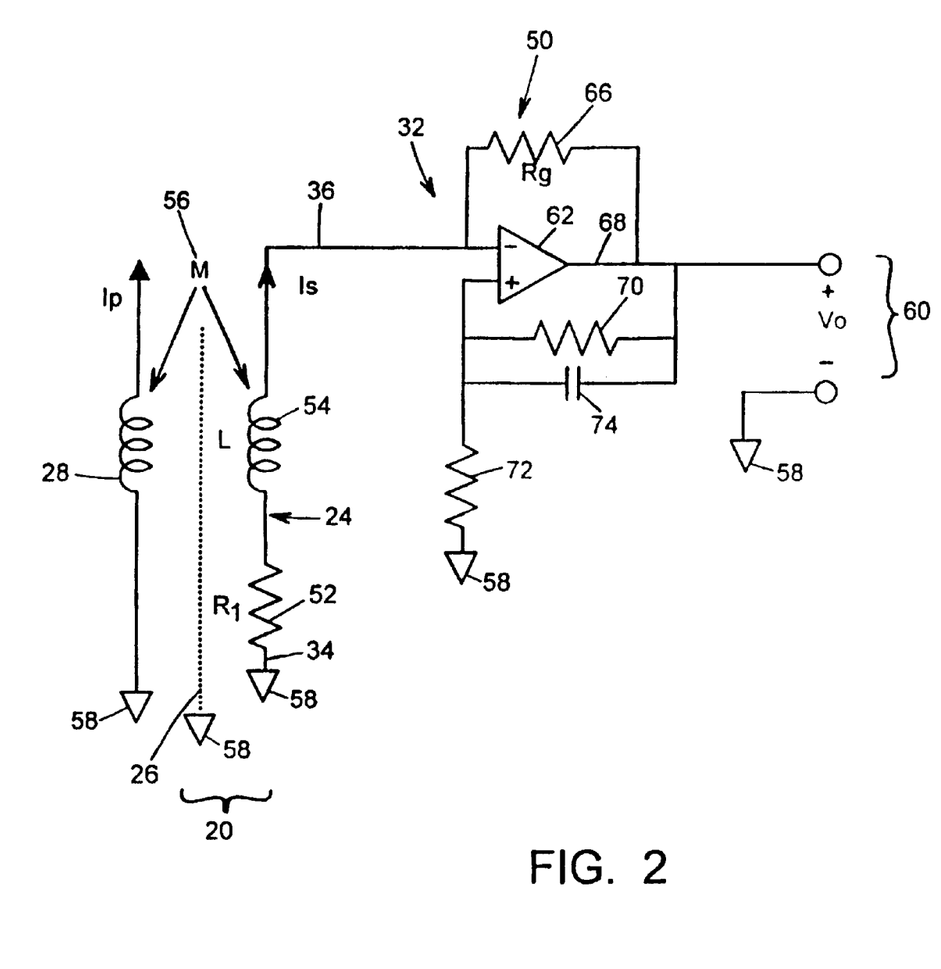
FIG. 2 illustrates one possible circuit diagram for the embodiment shown in FIG. 1.

FIG. 2 depicts one possible circuit diagram 50 for the current meter 18 shown in FIG. 1. As shown in FIG. 2, the winding 24 of the probe 20 may be represented by a winding resistance 52 in series with a winding inductance 54. Currents in the conductor 28 are magnetically coupled via a mutual inductance 56 to the winding 24. One end of the shield 26 is connected to a circuit ground or reference potential 58 to shunt stray electric fields, thereby preventing them from coupling to the winding 24. Secondary currents are coupled to the transimpedance amplifier 32 via wire 36 and are amplified therein to provide an output voltage 60.

The transimpedance amplifier 32 is preferably implemented using a wide-band operational amplifier (op-amp) 62. For example, the commercially available Maxim 4107 or the Burr-Brown OPA640 provide a large unity gain bandwidth that is suitable for use with the present invention. The op-amp 62 is connected in an inverting gain configuration. Thus, secondary currents are applied to an inverting input terminal 64 of the op-amp 62, and an inverting gain resistance 66 is connected between the inverting input 64 and output terminal 68. The transimpedance amplifier 32 may optionally include positive feedback resistors 70, 72 and a capacitor 74 that are connected to a non-inverting terminal 76 of the op-amp 62 as shown in FIG. 2.

The general expression representing the transimpedance gain ($Z_t$) or sensitivity ($\delta$) for the circuit 50 may be calculated by substituting variables for the various circuit component values and node currents/voltages. For example, where the current in the conductor 28 equals $I_p$, the mutual inductance 56 equals M, the inverting gain resistance 66 equals $R_g$, the winding inductance 54 equals L, the winding resistance 52 equals $R_1$, and the positive feedback resistors 70, 72 and capacitor 74 are not included (i.e., the non-inverting input 76 is connected to the reference potential 58), the transfer impedance, the ratio of the output voltage 60 ($V_o$) to the current $I_p$ flowing in the conductor 28, is given by Equation 1 below.

$$\delta = Z_t = V_o/I_p = -j\omega M R_g/(R_1 + j\omega L) \qquad \text{Equation 1}$$

As can be seen from Equation 1 above, for frequencies much greater than $R_1/L$ the impedance of the secondary winding 24 is dominated by the reactance ($j\omega L$) of the winding inductance 54. As a result, for frequencies much greater than $R_1/L$ the sensitivity ($\delta$) is substantially flat or independent of frequency as shown by Equation 2 below (where n equals the number of turns in the secondary winding 24).

$$\delta = Z_t \approx -R_g M/L = -R_g/n \qquad \text{Equation 2}$$

In accordance with the present invention, the material for the winding 24, the number of turns (n) used in the winding 24, the value ($R_g$) of the inverting gain resistance 66, and the characteristics of the op-amp 62 are all specifically selected to optimize the sensitivity ($\delta$) of the current meter 18 (shown in FIG. 1) over a wide band of frequencies defined from a low operative frequency ($f_L$) up to a high operative frequency ($f_H$) In general, the aforementioned parameters interact with each other so that their selection involves numerous design considerations and/or tradeoffs. One aspect of the present invention includes a synergistic combination of these parameters so that the useful application bandwidth (i.e., $f_H - f_L$) of the current meter 18 may be greatly extended.

As indicated by Equation 2 above, the sensitivity ($\delta$) of the current meter 18 is proportional to the inverting gain resistance 66 divided by the number of turns (n) used in the winding 24 as shown in Equation 3 below.

$$\delta \propto R_g/n \qquad \text{Equation 3}$$

As indicated by Equation 1 above, the low operative frequency ($f_L$) occurs where $\omega L \approx R_1$, or where $\omega \approx R_1/L$. Thus, the low operative frequency ($f_L$) is proportional to $R_1/L$ (i.e., $f_L \propto R_1/L$). As is known in the art, the winding resistance 52 is directly proportional to the number of turns (n) in the winding 24, the resistivity ($\rho$) of the winding material, and the winding inductance 54 are directly proportional to the square of the number of turns (n) in the winding 24. Thus, in general, the low operative frequency ($f_L$) is directly proportional to the resistivity ($\rho$) of the winding 24 and inversely proportional to the number of turns (n) in the winding 24 as shown in Equation 4 below.

$$f_L \propto \rho/n \qquad \text{Equation 4}$$

For a typical toroidal core geometry, it can be shown that the general relationship shown above in Equation 4 becomes the more particular relationship described by Equation 5 below.

$$f_L = (\rho l)/(a\mu\pi n r) \qquad \text{Equation 5}$$

Where "l" equals the mean circumference of the winding 24 "a" equals the cross-sectional area of the wire used in the winding, "$\mu$" equals the permeability of the core 22, and "r" equals the radius of the turns of the winding 24. The high operative frequency ($f_H$) is inversely proportional to the number of turns (n) in the winding 24 because, as is known in the art, as the total length of a winding increases the frequency at which the winding self-resonates decreases. Equation 5 below summarizes the general relationship between the high operative frequency ($f_H$), the number of turns (n), $$f_H \propto 1/n \qquad \text{Equation 6}$$

More specifically, the winding will typically self-resonate when the quarter wavelength of the signal traveling on the winding approximately equals the length of the winding. Thus, for a toroidal core geometry the high operative frequency ($f_H$) may be expressed as shown in Equation 7 below.

$$f_H = c/(8\pi r n) \qquad \text{Equation 7}$$

Where "c" equals the speed of light and "r" equals the radius of the turns.

Using Equations 5 and 7 above the relative operating bandwidth of a toroidal probe can be represented as shown in Equation 8 below.

$$f_H/f_L = (\mu c a)/(8\rho l) \qquad \text{Equation 8}$$

Replacing the variables in Equation 8 above with values that would be provided by a toroidal current probe constructed in accordance with the present invention yields an $f_H/f_L$ ratio greater than 1000, which is substantially greater than the ratio presently provided by conventional current probe designs.

Several probe design considerations and tradeoffs are apparent from Equations 4–8 above. First, to achieve the greatest possible bandwidth the winding materials should have as low a resistivity as possible, the cross-sectional area of the wire should be as large as possible, and the mean circumference of the winding should be as small as possible. Second, to position the bandwidth over a desired range of operating frequencies (i.e., $f_L$ to $f_H$) the number of turns (n) will have to optimized because $f_L$ and $f_H$ are both inversely proportional to n.

Equations 1–3 above further indicate that for a given probe design with the desired bandwidth the sensitivity of the circuit 50 may be increased by increasing the value ($R_g$) of the inverting gain resistance 66. The inverting gain resistance 66, however, cannot be arbitrarily increased because a time constant is defined by the product of the inverting gain resistance 66 and the aggregate of various stray capacitances surrounding the op-amp 62. This time constant defines a pole in the feedback loop that produces a high frequency rolloff. Thus, the upper operative frequency of the complete current meter 18 will be at the lower of the upper operative frequency of the probe 20 and the transimpedance amplifier 32.

By way of example only, the selection of specific parameter values may proceed in the following manner. First, a lower operative frequency ($f_L$) and upper operative frequency ($f_H$) are selected. For applications where high frequency currents flowing in a portion of a human body are being measured, the lower operative frequency is typically selected to be several hundred kilohertz and the upper operative frequency is typically selected to be greater than 100 MHz. The op-amp 62 and the inverting gain resistance 66 may then be selected so that the upper cutoff frequency of the transimpedance amplifier 32 exceeds the desired high operative frequency. Namely, the value of the inverting gain resistance 66 is made as large as possible for the given gain-bandwidth product of the op-amp 62. Those, skilled in the art will recognize that op-amps having a larger gain-bandwidth product are preferable because they permit greater sensitivities for any given high operative frequency.

A winding material having the lowest practicable resistivity is selected and the number of turns is then optimally selected to achieve as closely as possible the desired low and high operative frequencies. In one embodiment, for example, a toroidal core having a tube radius of 1.2 cm and a mean diameter of 14 cm was wrapped with a secondary winding having 63 turns of #24 copper wire. An aluminum shield having a tube radius of 1.5 cm surrounded the core. This configuration, when connected to a transimpedance amplifier constructed in accordance with the present invention, yielded a flat sensitivity response over a frequency range of 0.4 MHz to 120 MHZ.

The value of the inverting gain resistance 66 may optionally be adjusted to increase or decrease sensitivity as needed, but it should be recognized that increasing $R_g$ may decrease the high operative frequency if the op-amp 62 does not have sufficient gain-bandwidth product. In applications measuring high frequency currents in humans, for example, the sensitivity preferably exceeds 100 Ohms.

As noted above, it may also be desirable in many applications to use a winding that maintains a substantially constant resistance over frequency. If a thin conducting film, such as a metallized mylar is used, the thickness (t) of the film should be selected to be less than the skin depth at the upper operative frequency ($f_H$). Equation 9 below summarizes this relationship.

$$t < SQRT[\rho/(\pi f_H \mu_o)]$$  Equation 9

The above parameter selection generally illustrates one manner by which parameters for the circuit 50 may be selected to implement aspects of the present invention. There are a number of practical considerations that may additionally be considered in selecting these parameters. For example, the dimensions of the core may be constrained by the application. Specifically, in an application measuring currents flowing through the torso of a human, the core is necessarily large. As described by Equation 8 above, the achievable bandwidth is generally reduced as the length of the core increases. Also, terminations and lead wires must be minimized in length and shielded. For example, as the length of the wires 34, 36 coupling the winding 24 to the transimpedance amplifier 32 increase, the effective winding resistance 52 increases and the total length of winding 24 increases. As suggested by the above equations, increased winding resistance will increase the lowest possible operative frequency and will decrease the highest possible operative frequency (i.e., bandwidth will suffer). Furthermore, long wire lengths will increase stray capacitive effects that could degrade the accuracy and signal-to-noise ratio of the current meter 18. Finally, cost considerations may limit, for example, the available selection of op-amps to those having lower gain-bandwidth products and/or may limit the selection of winding materials to those having relatively higher resistivities.

With continued reference to FIG. 2, the optional positive feedback resistors 70, 72 and capacitor 74 may be included to cancel some or all of the impedance of the winding 24. This type of reactance reduction, via regenerative or positive feedback, is generally known in the art, and is discussed in detail, for example, in U.S. Pat. Nos. 5,296,866 and 5,311,198 to Sutton, which are incorporated herein by reference in their entirety. In general, values for the resistors 70, 72 are selected to produce a negative resistance that cancels the winding resistance 52, and a value for the capacitor 74 is selected to produce a negative inductance that cancels the winding inductance 54. This cancellation of impedance in the winding 24 results in a higher sensitivity because higher secondary currents are produced for a given field strength. To prevent oscillations over a wide range of operating conditions, the positive feedback is typically selected so that the winding impedance is not completely canceled, which provides a slightly positive net impedance as a design margin.

Figure 3:
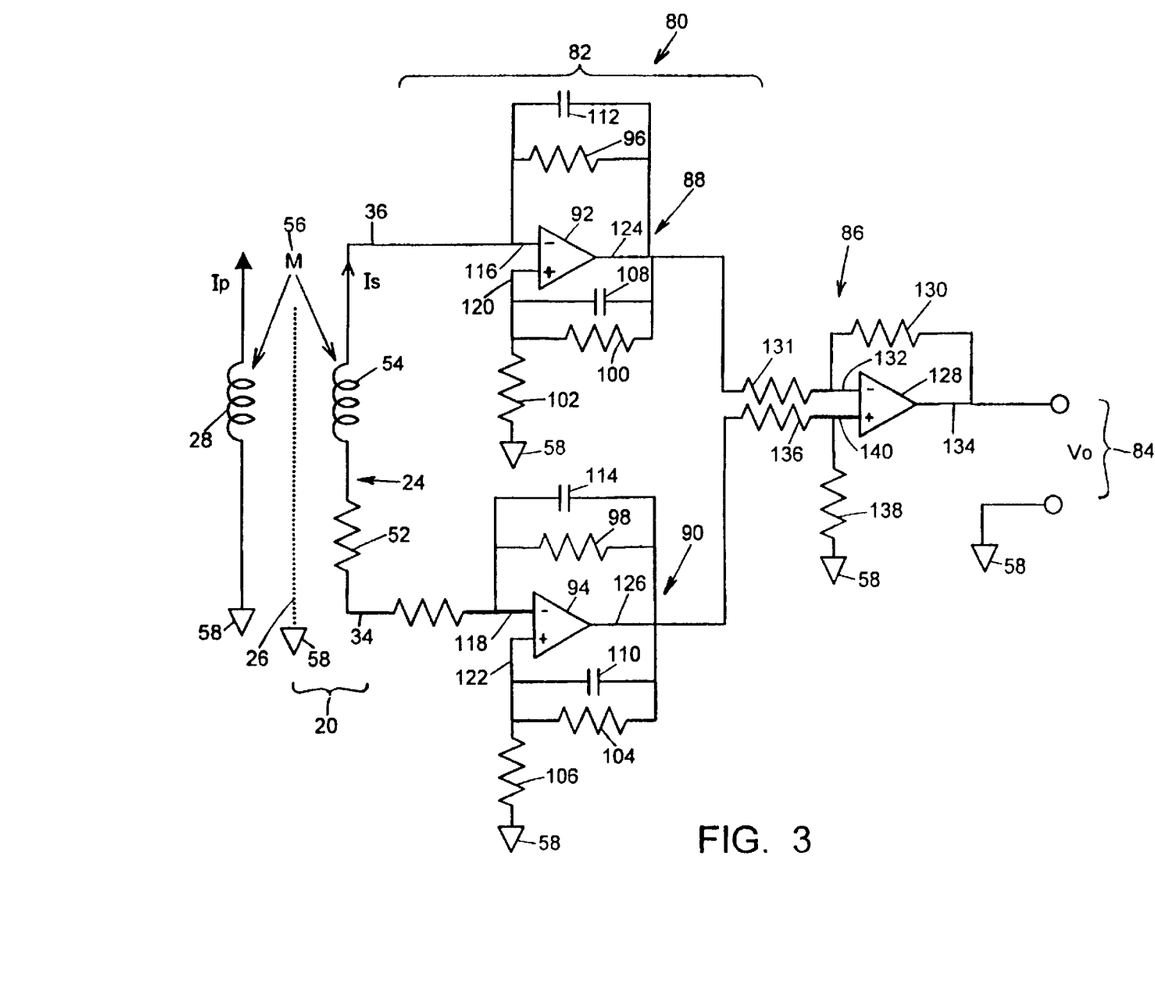
FIG. 3 illustrates another possible circuit diagram for the embodiment shown in FIG. 1.

FIG. 3 illustrates another possible circuit diagram 80 of the current meter 18 shown in FIG. 1. The current probe 20 is connected via the wires 34, 36 to a differential transimpedance amplifier 82. The differential voltage output of the transimpedance amplifier 82 is converted to a single-ended voltage output 84 via a differential input voltage amplifier 86.

The differential transimpedance amplifier 82 includes a pair of transimpedance amplifiers 88, 90 that are preferably matched to provide a balanced input to the winding 24. As is known in the art, a balanced input provides a high immunity to common mode interference due to stray fields that may degrade accuracy and/or the signal-to-noise ratio of the current meter 18. The amplifiers 88, 90 include operational amplifiers 92, 94. The operational amplifiers 92, 94 are in an inverting gain configuration with negative feedback resistances 96, 98 and may further include optional positive feedback resistors 100, 102, 104, 106 and capacitors 108, 110. The amplifiers 88, 90 may also include compensation capacitors 112, 114 to cancel stray capacitances that may be present on the inverting input terminals 116, 118, the inverting terminals 120, 122 or the output terminals 124, 126 of the op-amps 92, 94. The output terminals 124, 126 of the amplifiers 88, 90 are coupled to the differential voltage amplifier 86. The differential voltage amplifier 86, includes an op-amp 128 having inverting gain resistors 130, 131 connected between an inverting input terminal 132 and an output terminal 134. Voltage divider resistors 136, 138 are connected as shown in FIG. 3 to a non-inverting input terminal 140.

Figure 4:
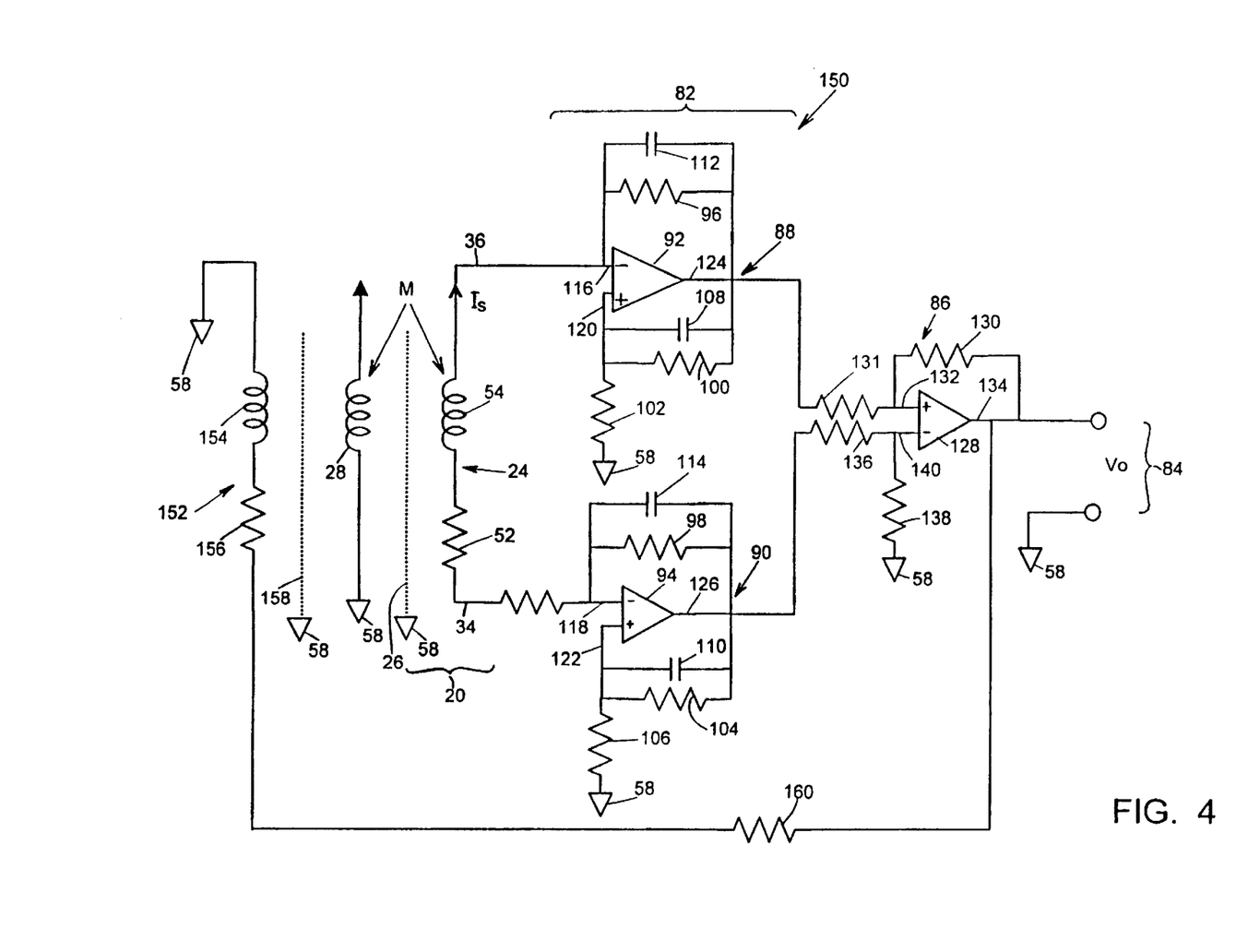
FIG. 4 illustrates a circuit diagram for an alternative embodiment of the current meter shown in FIG. 1.

Illustrated in FIG. 4 is a circuit diagram 150 for an another embodiment of the current meter 18 shown in FIG. 1. In general, a feedback winding 152 is magnetically coupled to the winding 24 and has an inductance 154 in series with a resistance 156 that are used to cancel impedance in the winding 24. Preferably, the feedback winding 152 is wrapped on the core 22 (shown in FIG. 1) to provide more precise coupling characteristics. A second shield 158 is preferably included to shunt stray fields.

The feedback winding 152 may be used in place of or to supplement the positive feedback resistors 100, 102, 104, 106 and capacitors 108, 110. The output terminal 134 of the differential voltage amplifier 86 drives the feedback winding 152 through a feedback resistor 160. The output voltage 84 of the amplifier 86 and the feedback resistor 160 are made as large as possible so that they more closely approximate a current source to the feedback winding 152.

Figure 5:
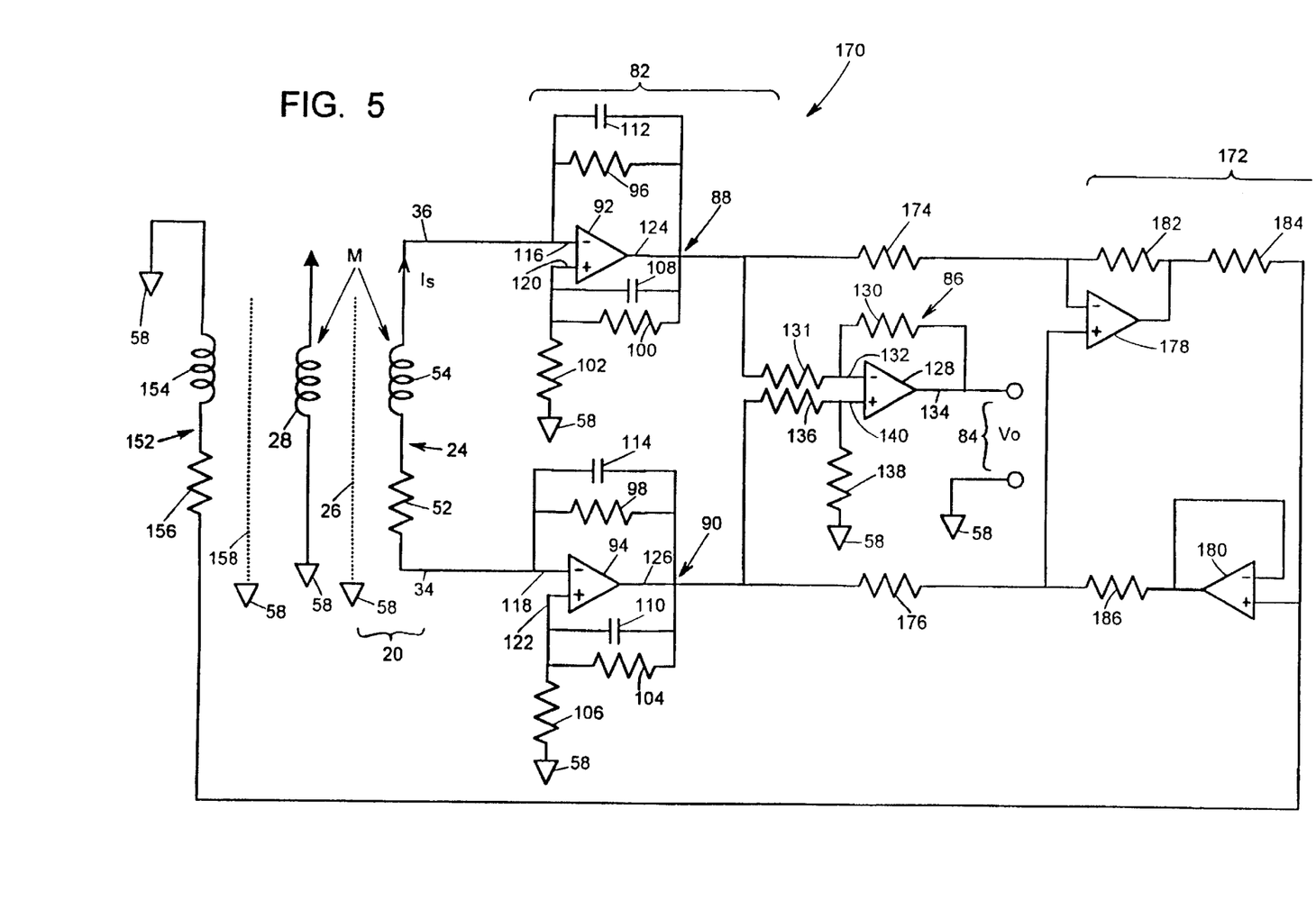
FIG. 5 illustrates another possible circuit diagram for the alternative embodiment represented in FIG. 4.

Illustrated in FIG. 5 illustrates is another possible circuit diagram 170 for the alternative embodiment represented in FIG. 4. In the circuit 170 shown in FIG. 5, feedback current is provided to the feedback winding 152 via a Howland current source 172. The Howland current source 172 is coupled to the output terminals 124, 126 of the transimpedance amplifiers 88, 90 through resistors 174, 176. The Howland current source 172 includes op-amps 178, 180 and resistors 182, 184, 186 that are coupled together as shown. As is known, the Howland current source 172 produces a voltage across the resistor 184 that is proportional to the voltage difference between the voltage outputs 124, 126 of the transimpedance amplifiers 88, 90, thereby providing a proportional current to the feedback winding 152.

Figure 6:
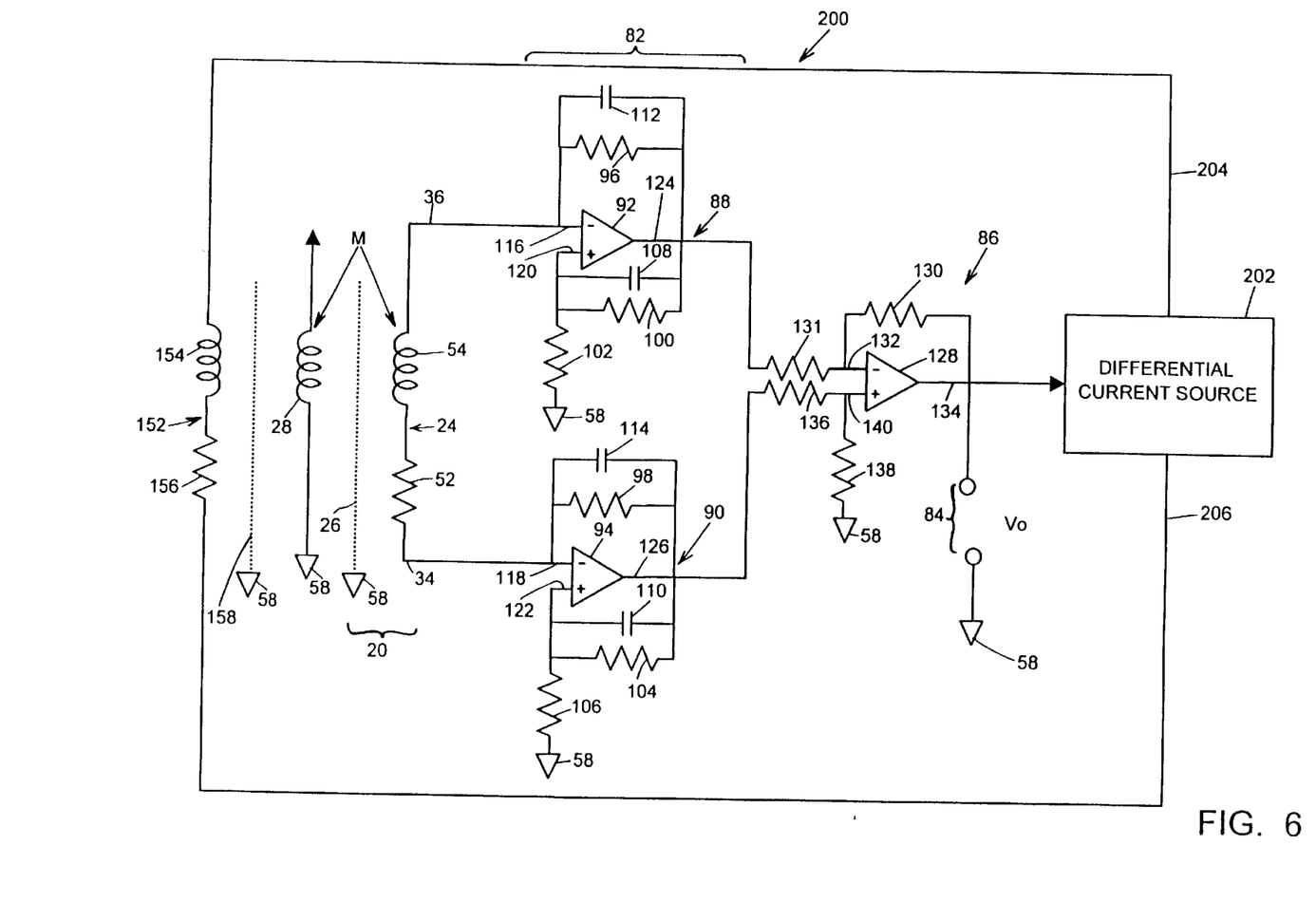
FIG. 6 illustrates yet another possible circuit diagram for the alternative embodiment represented in FIG. 4.

Illustrated in FIG. 6 is another possible circuit diagram 200 for the alternative embodiment represented in FIG. 4. The feedback resistor 160 (shown in FIG. 4) is replaced with a differential current source 202 that is driven by the output 134 of the differential voltage amplifier 86. The differential current source provides a floating current via lines 204, 206 to the feedback winding 152.

Figure 7:
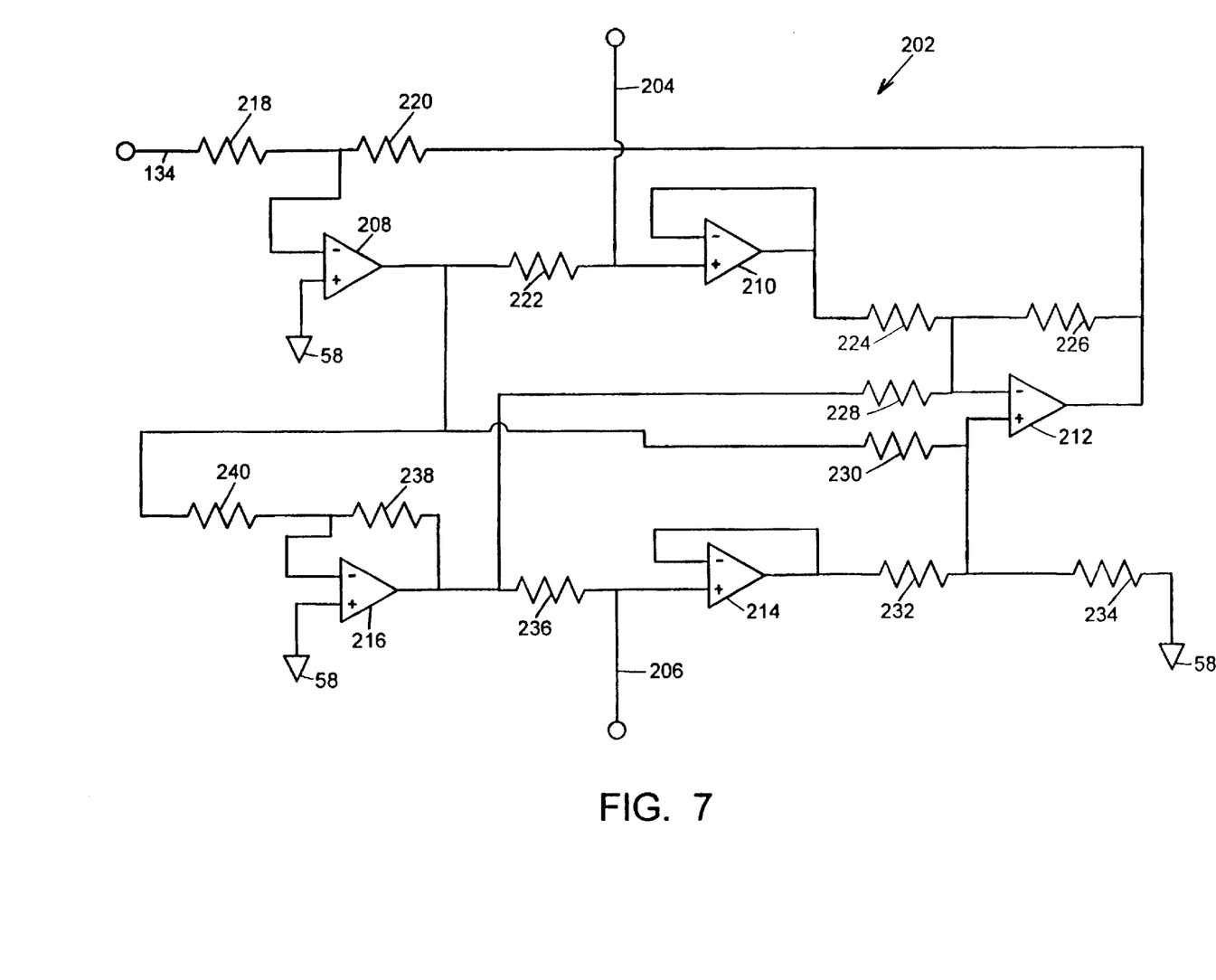
FIG. 7 illustrates a more detailed circuit diagram of a differential current source that may be used with the circuit shown in FIG. 6.

Illustrated in FIG. 7 is a more detailed circuit diagram of the differential current source 202 shown in FIG. 6. The current source 202 includes operational amplifiers 208, 210, 212, 214, 216 and resistors 218 through 240 all coupled together as shown. The current source 202 is known and is described in more detail in U.S. Pat. No. 5,021,729 to Sutton, which is incorporated herein by reference in its entirety.

Figure 8:
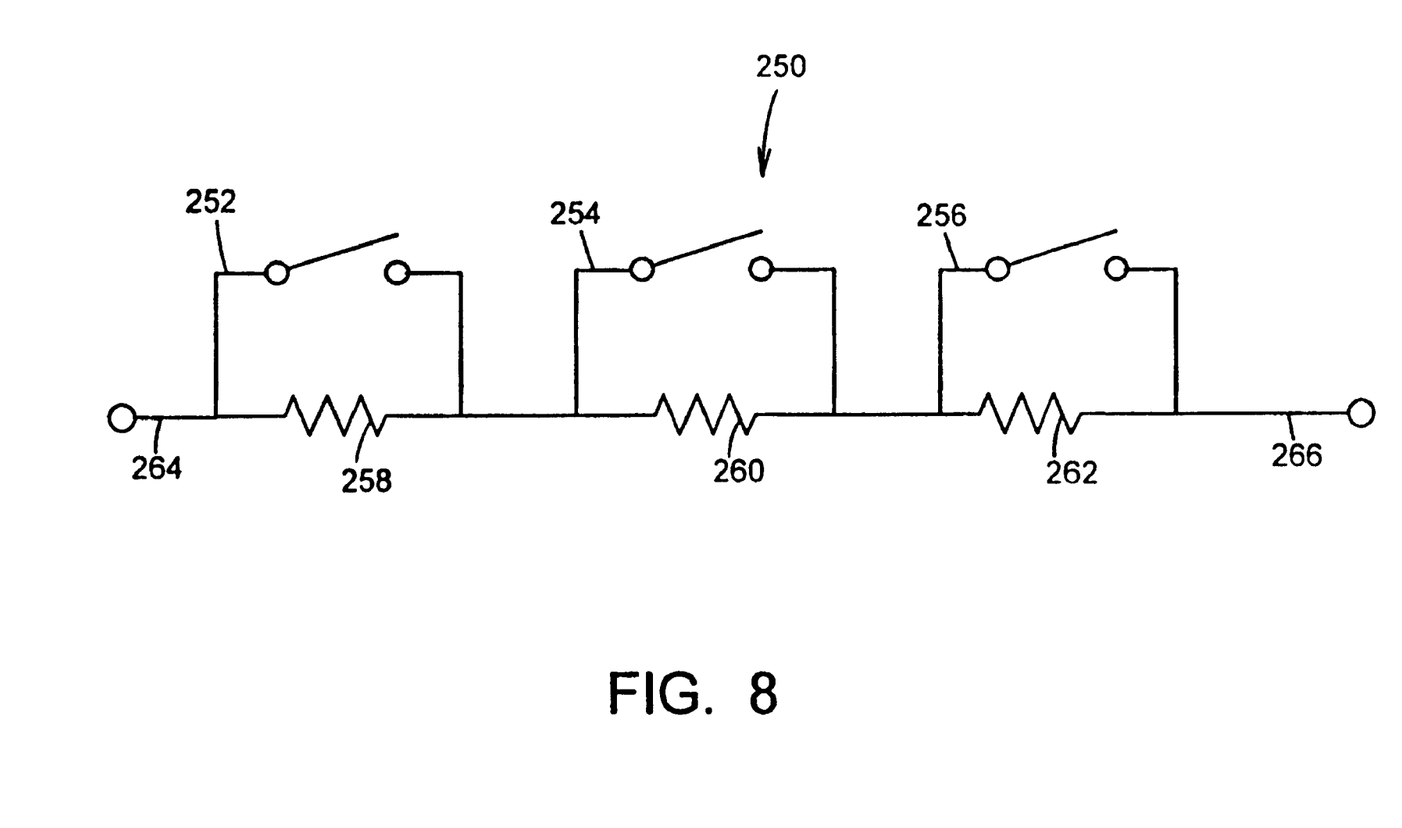
FIG. 8 illustrates one example of a selectable resistor network that may be used with various embodiments of the present invention.

Illustrated in FIG. 8 is a selectable resistor network 250 that includes a plurality of switches 252, 254, 256 connected in parallel across a respective plurality of series connected resistances 258, 260, 262. The switches may be opened and closed to produce various combinations of equivalent series resistance between terminals 264, 266. One or more of the resistor networks 250 may be substituted for the various gain resistors disclosed in the above described embodiments. For example, the inverting gain resistor 66 used in the circuit 50 shown in FIG. 2 may be replaced with the resistor network 250 to allow a variable or selectable sensitivity based on the state of the switches. The switch positions may be controlled manually be a user, or may alternatively be controlled automatically via a microprocessor, for example, to auto-range the senstivity of the circuit 50 based on the magnitude of the input signals.

Of course, it should be understood that a range of changes and modifications can be made to the preferred embodiment described above. It is therefore intended that the foregoing detailed description be regarded as illustrative rather than limiting and that it be understood that it is the following claims, including all equivalents, which are intended to define the scope of this invention.

What is claimed is:

1. Apparatus for measuring high frequency currents flowing through an object, comprising:
   a non-ferrous core current probe having a secondary winding with a secondary winding resistance and a secondary winding reactance such that the secondary winding resistance is substantially smaller than the secondary winding reactance from a low operative frequency to a high operative frequency; and
   a wide-band transimpedance amplifier circuit coupled to the secondary winding and adapted to amplify currents provided by the secondary winding so that the sensitivity of the current probe is substantially flat from the low operative frequency to the high operative frequency.

2. The apparatus of claim 1, wherein the high operative frequency is at least one hundred times greater than the low operative frequency.

3. The apparatus of claim 1, wherein the low operative frequency is less than or equal to about 400 KHz and the high operative frequency is greater than or equal to about 120 MHz.

4. The apparatus of claim 1, wherein the current probe has a toroidal shape.

5. The apparatus of claim 1, wherein the current probe is made primarily of flexible materials.

6. The apparatus of claim 1, wherein the secondary winding is made of a low resistivity wire.

7. The apparatus of claim 1, wherein the secondary winding is made of a low resistivity film.

8. The apparatus of claim 1, wherein the secondary winding has a substantially constant resistance from at least the low operative frequency to at least the high operative frequency.

9. The apparatus of claim 1, wherein the winding is made of a material having a substantially constant resistivity over temperature.

10. The apparatus of claim 1, wherein the transimpedance amplifier comprises a balanced differential input.

11. The apparatus of claim 1, wherein the transimpedance amplifier comprises at least one operational amplifier.

12. The apparatus of claim 1, wherein the transimpedance amplifier uses at least some positive feedback.

13. The apparatus of claim 1, wherein the transimpedance amplifier comprises a plurality of selectable gain resistors.

14. The apparatus of claim 1, wherein the current probe further comprises a shield surrounding and electrically separated from the secondary winding.

15. The apparatus of claim 14, wherein the shield is made of a high resistivity material.

16. The apparatus of claim 14, wherein the shield is made of a low resistivity material.

17. The apparatus of claim 16, wherein the shield is made substantially of metal.

18. The apparatus of claim 17, wherein the shield is made substantially of aluminum.

19. The apparatus of claim 14, wherein the shield is made substantially of a flexible material.

20. The apparatus of claim 14, wherein the shield further comprises a gap extending substantially along the length of the shield.

21. The apparatus of claim 1, further comprising a feedback winding adapted to cancel at least some of the impedance of the secondary winding.

22. The apparatus of claim 21, further comprising a voltage controlled current source circuit coupled to the transimpedance amplifier circuit and providing a feedback current to the feedback winding.

23. The apparatus of claim 22, wherein the voltage controlled current source is in a Howland configuration.

24. The apparatus of claim 22, wherein the voltage controlled current source provides a floating differential output.

25. The apparatus of claim 22, wherein the voltage controlled current source comprises at least one operational amplifier.

* * * * *